(12) United States Patent
Yoon et al.

(10) Patent No.: US 8,542,331 B2
(45) Date of Patent: Sep. 24, 2013

(54) DISPLAY APPARATUS

(75) Inventors: Min-Ho Yoon, Suwon-si (KR); Seung-Ju Lee, Hwaseong-si (KR); Jong-Seong Kim, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 512 days.

(21) Appl. No.: 12/818,766

(22) Filed: Jun. 18, 2010

(65) Prior Publication Data

US 2011/0019141 A1  Jan. 27, 2011

(30) Foreign Application Priority Data

Jul. 24, 2009 (KR) .................. 10-2009-0068003

(51) Int. Cl.
*G02F 1/136* (2006.01)

(52) U.S. Cl.
USPC .......................................................... 349/43

(58) Field of Classification Search
None
See application file for complete search history.

(56) References Cited

U.S. PATENT DOCUMENTS

| | | | |
|---|---|---|---|
| 2002/0053668 A1* | 5/2002 | Kim .................................. | 257/59 |
| 2002/0067452 A1* | 6/2002 | Sakamoto et al. ............ | 349/139 |
| 2002/0074549 A1* | 6/2002 | Park et al. ...................... | 257/59 |
| 2005/0041170 A1* | 2/2005 | Chae ............................... | 349/43 |
| 2007/0002201 A1* | 1/2007 | You ................................. | 349/43 |
| 2007/0013846 A1 | 1/2007 | Rho et al. | |
| 2007/0085963 A1* | 4/2007 | Huang et al. ................. | 349/152 |
| 2008/0266508 A1 | 10/2008 | Kim | |
| 2010/0060841 A1* | 3/2010 | Shinn et al. .................. | 349/150 |

FOREIGN PATENT DOCUMENTS

| | | |
|---|---|---|
| JP | 2000-258782 | 9/2000 |
| JP | 2004-077856 | 3/2004 |
| JP | 2006-053567 | 2/2006 |
| KR | 10-0341124 | 6/2002 |
| KR | 1020040004855 | 1/2004 |
| KR | 1020050060224 | 6/2005 |
| KR | 1020060088617 | 8/2006 |
| KR | 10-0807580 | 2/2008 |

* cited by examiner

*Primary Examiner* — Thanh-Nhan P Nguyen
(74) *Attorney, Agent, or Firm* — H.C. Park & Associates, PLC

(57) ABSTRACT

A display device is provided that improves product yield thereof. The display device according to the present invention includes: an insulation substrate; a plurality of gate pad metal layers disposed in a first direction on the substrate; a plurality of data pad metal layers disposed in a second direction on the substrate; a gate fanout unit connecting the gate pad metal layers and gate lines of a display area; a data fanout unit connecting the data pad metal layers and data lines of the display area; and a first insulating layer pattern on the gate pad metal layers, the data pad metal layers, the gate fanout unit, and the data fanout unit, wherein the first insulating layer pattern is partially removed on at least a portion of a region between two neighboring gate pad metal layers, or two neighboring data pad metal layers, thereby forming a first opening.

18 Claims, 10 Drawing Sheets

DISPLAY APPARATUS

CROSS-REFERENCE TO RELATED APPLICATION

This application claims priority from and the benefit of Korean Patent Application No. 10-2009-0068003, filed on Jul. 24, 2009, which is hereby incorporated by reference for all purposes as if fully set forth herein.

BACKGROUND OF THE INVENTION

1. Field of the Invention

Exemplary embodiments of the present invention relate to a display device. More particularly, exemplary embodiments of the present invention relate to a display device improving a product yield.

2. Discussion of the Background

Generally, a display device displays images in response to an externally input image signal. A liquid crystal display is a flat panel display that displays images using an optical characteristic of a liquid crystal.

The liquid crystal display has a liquid crystal panel displaying an image through an image signal, and is a non-emissive element that does not emit light itself such that a backlight assembly is typically used for providing light to the liquid crystal panel.

A liquid crystal display is constructed by executing a module process through a liquid crystal process for inserting liquid crystal after respectively manufacturing a lower substrate and an upper substrate. Further, in the module process, a circuit board and a driving chip are connected to the display panel, and the backlight and the chassis are assembled thereto.

The liquid crystal panel includes a plurality of gate lines and data lines for transmitting scan and data signals, respectively, and the ends of the data lines and the gate lines are respectively formed as a pad to be electrically connected to the driving chip and the circuit board. An insulating layer is formed on each pad, and a transparent electrode is disposed on the insulating layer. The insulating layer has a via hole partially exposing an upper portion of the pad. A transparent electrode is electrically connected to the pad through the via hole. The driving chip and the circuit board may be adhered to the liquid crystal panel through an anisotropic conductive film, thereby being electrically connected to the transparent electrode.

The insulating layer is partially removed only on a portion of the pad such that conventionally the insulating layer remains between neighboring pads. However, for a liquid crystal panel using a plastic substrate, a crack of the insulating layer may be generated due to pressure applied during the module process and deformation of the plastic substrate may also occur, and a crack of the metal wiring may be generated as a result of the crack of the insulating layer. Accordingly, electrical disconnection of the metal wiring may be generated and abnormal images may be displayed.

SUMMARY OF THE INVENTION

Exemplary embodiments of the present invention provide a display device that may prevent cracks that may be generated in the metal wiring of the pad units and/or the fanout unit during a module process, such that display of an abnormal image due to electrical disconnection may be prevented, and as a result the product yield may be improved.

Additional features of the invention will be set forth in the description which follows, and in part will be apparent from the description, or may be learned by practice of the invention.

An exemplary embodiment of the present invention discloses a display device including an insulation substrate, a plurality of gate pad metal layers disposed in a first direction on the substrate, a plurality of data pad metal layers disposed in a second direction on the substrate, a gate fanout unit connecting the gate pad metal layers and gate lines of a display area, a data fanout unit connecting the data pad metal layers and data lines of the display area. and a first insulating layer pattern on the plurality of gate pad metal layers, the plurality of data pad metal layers, the gate fanout unit, and the data fanout unit. The first insulating layer pattern does not completely cover a region between two neighboring gate pad metal layers, or two neighboring data pad metal layers, thereby forming a first opening.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
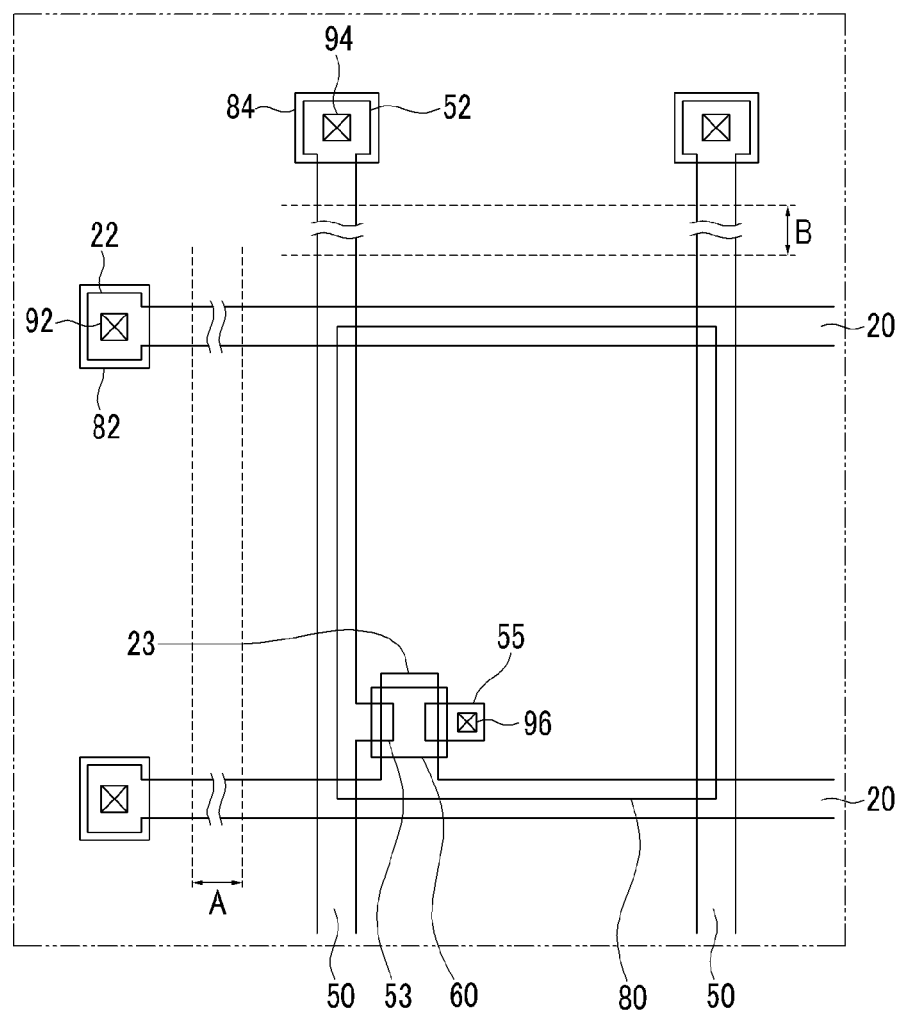
FIG. 1 is a view schematically showing a liquid crystal display according to an exemplary embodiment of the present invention.

The invention is described more fully hereinafter with reference to the accompanying drawings, in which exemplary embodiments of the invention are shown. This invention may, however, be embodied in many different forms and should not be construed as limited to the embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. The thickness of layers, films, panels, regions, etc. may also be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

FIG. 1 is a view schematically showing a liquid crystal display according to an exemplary embodiment of the present invention.

Referring to FIG. 1, a liquid crystal display includes an insulation substrate on which a plurality of gate lines 20 extend in a transverse direction and a plurality of data lines 50 extend in a longitudinal direction. The liquid crystal display includes a display area for displaying images through pixel electrodes 80 and a non-display area disposed outside of the display area. The plurality of gate lines 20 and the plurality of data lines 50 that are crossed divide the display area as a matrix, and while the pixel electrodes 80 in FIG. 1 overlap the gate lines 20 and the data lines 50, they do not overlap each other. In another exemplary embodiment, a gate pad 22 transmitting a gate signal to the gate line 20 is connected to one end of the gate line 20, and a gate fanout unit A connecting the gate pad 22 of the non-display area and the gate line 20 of the display area is formed. The gate fanout unit A may connect to the gate pad 22 through metal layers 160 of the gate pad unit, described below. Likewise, a data pad 52 transmitting a data signal to the data line 50 is connected to one end of the data line 50, and a data fanout unit B connecting the data pad 52 of the non-display area and the data line 50 of the display area is formed. The data fanout unit B may connect to the data pad 52 through metal layers 160 of the data pad unit, described below. Here, the portion where the gate pads 22 are disposed is referred to as a gate pad unit and the portion where the data pads 52 are disposed is referred to as a data pad unit, and all gate pad units and data pad units are referred to as a pad unit. Also, the gate fanout unit A and the data fanout unit B are wholly referred to as a fanout unit. The pixel electrode 80 is connected to a thin film transistor including a gate electrode 23 connected to the gate line 20, a source electrode 53 connected to the data line 50, a drain electrode 55 facing the source electrode 53, and a semiconductor 60 connecting between the source electrode 53 and the drain electrode 55, such that the thin film transistor switches an electric signal applied to the pixel electrode 80 to display the images.

Generally, in the liquid crystal display, a gate insulating layer (not shown) is formed on the gate line 20 and the substrate on which the gate line 20 is formed, and the semiconductor 60 and an ohmic contact layer (not shown) are formed on the gate electrode 23 of the gate line 20. The data line 50 and the drain electrode 55 are formed on the ohmic contact layer and the gate insulating layer, and the data line 50 including the source electrode 53 extends to the upper portion of the ohmic contact layer. The drain electrode 55 is separated from the source electrode 53, and is disposed on the ohmic contact layer opposite to the source electrode 53 with respect to the gate electrode 23. An insulating layer is formed on the data line 50. Here, portions of the insulating layer may be removed in the pad unit including the gate pad 22 and the data pad 52, thereby forming contact holes 92 and 94, which permit the transmission of an electric signal from the outside to the gate line 20 and the data line 50. Also, the insulating layer has a contact hole 96 exposing the drain electrode 55, and the pixel electrode 80 is connected to the drain electrode 55 of the thin film transistor through the contact hole 96.

Also, an assistance gate pad 82 and an assistance data pad 84, which are respectively connected to the gate pad 22 and the data pad 52, are formed on the gate pad 22 and the data pad 52. Here, the assistance gate pad 82 and the assistance data pad 84 protecting the gate pad 22 and the data pad 52 are not essential, and may be formed of a transparent conductive material with the same layer as the pixel electrode 80, however the present invention is not limited thereto.

The gate pad 22 and the data pad 52 of FIG. 1 may have various shapes. That is, in FIG. 1, a pad similar to a square is shown, however, the pad may be elongated to thereby have a more rectangular shape. Therefore, the contact holes 92 and 94 may have a shape that is elongated similarly.

The gate pad 22, the gate fanout unit A, the data pad 52, and the data fanout unit B of the non-display area are schematically shown in FIG. 1 for convenience, however each region will be described in detail with reference to FIG. 2, FIG. 3, FIG. 4, FIG. 5, FIG. 6, FIG. 7, FIG. 8, FIG. 9, and FIG. 10.

Figure 2:
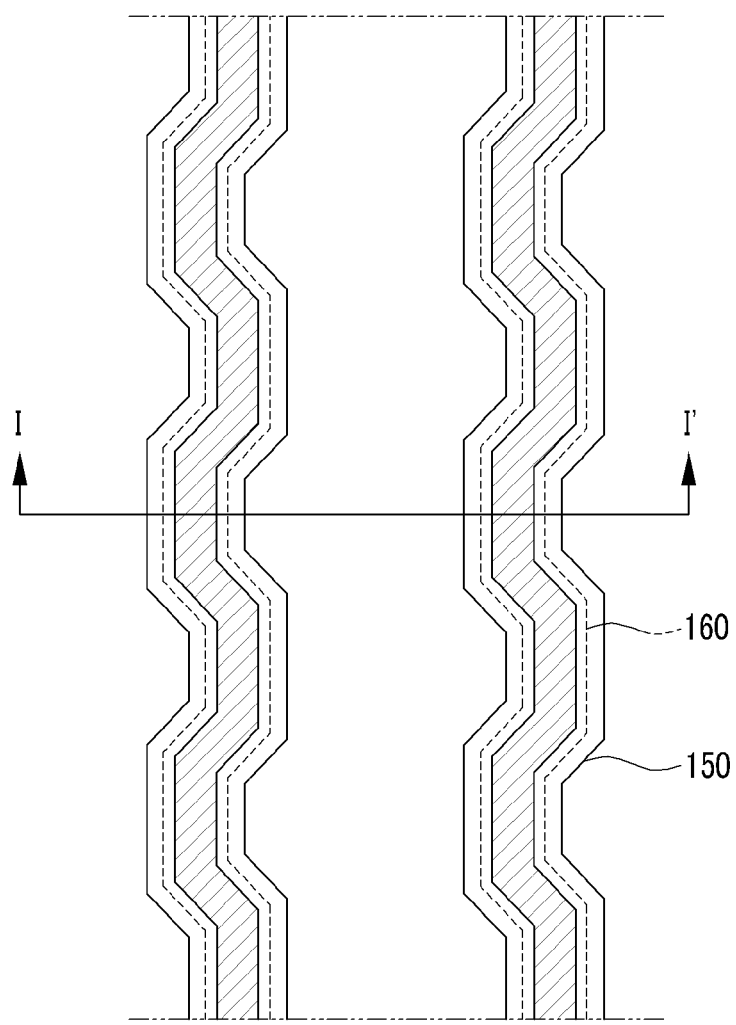
FIG. 2 is a top plan view showing a portion of a gate pad unit or a data pad unit of a display device according to an exemplary embodiment of the present invention.
Figure 3:
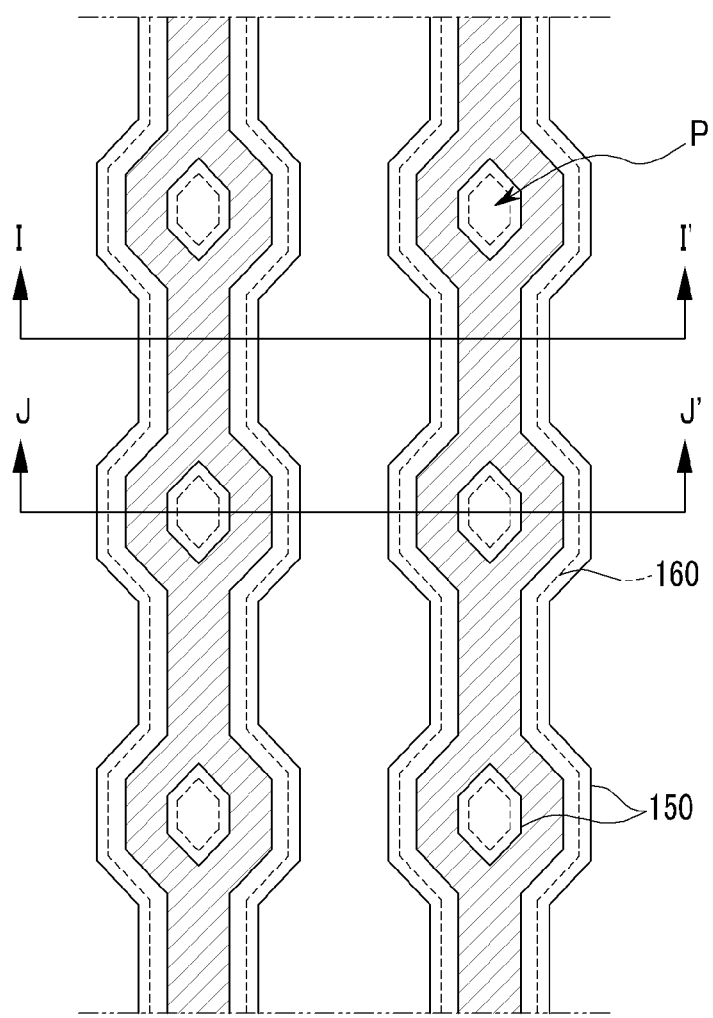
FIG. 3 is a top plan view showing a portion of a gate pad unit or a data pad unit of a display device according to another exemplary embodiment of the present invention.
Figure 4:
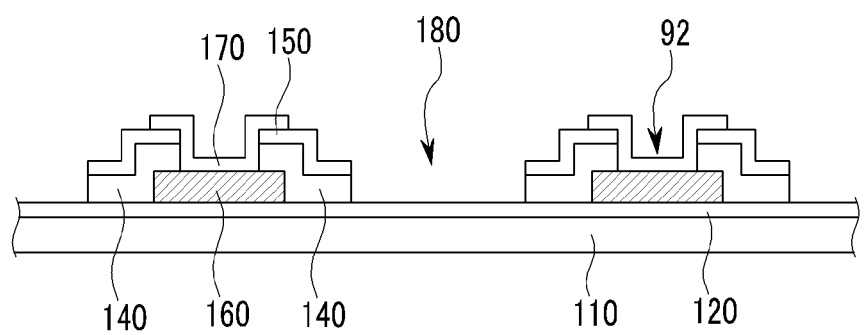
FIG. 4 is a cross-sectional view of a display device according to an exemplary embodiment of the present invention taken along the line I-I' of FIG. 2 or FIG. 3.
Figure 5:
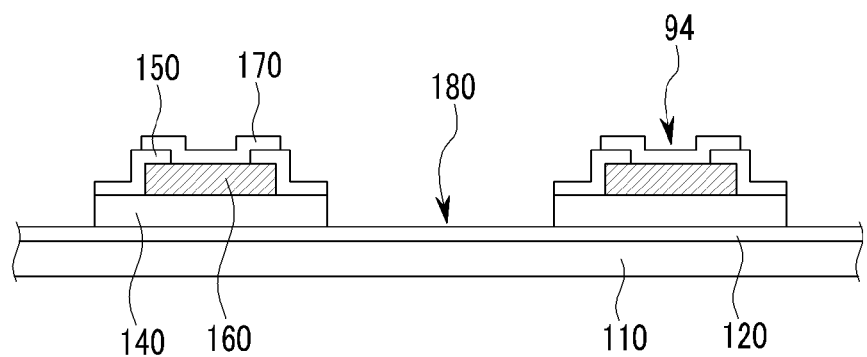
FIG. 5 is a cross-sectional view of a display device according to another exemplary embodiment of the present invention taken along the line I-I' of FIG. 2 or FIG. 3.
Figure 6:
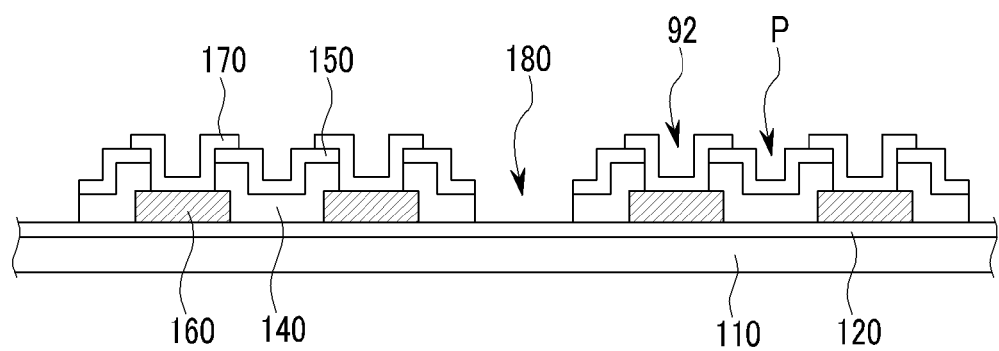
FIG. 6 is a cross-sectional view of a display device according to an exemplary embodiment of the present invention taken along the line J-J' of FIG. 3.
Figure 7:
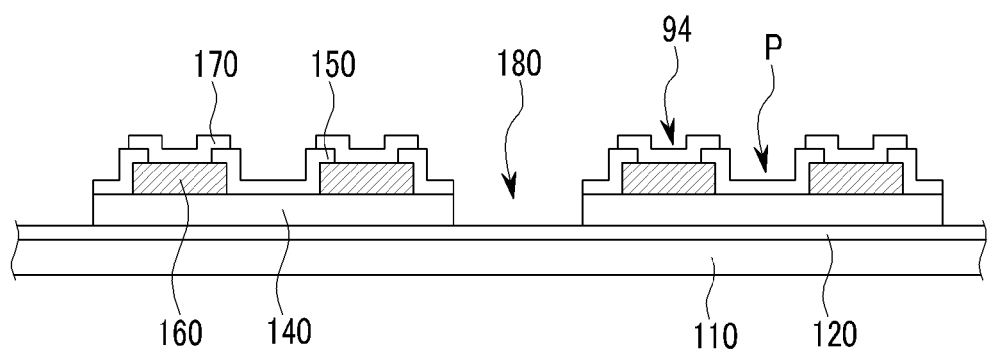
FIG. 7 is a cross-sectional view of a display device according to another exemplary embodiment of the present invention taken along the line J-J' of FIG. 3.

FIG. 2 is a top plan view showing a portion of a gate pad unit or a data pad unit of a display device according to an exemplary embodiment of the present invention. FIG. 3 is a top plan view showing a portion of a gate pad unit or a data pad unit of a display device according to another exemplary embodiment of the present invention. FIG. 4 is a cross-sectional view of a display device according to an exemplary embodiment of the present invention taken along the line I-I' of FIG. 2 or FIG. 3. FIG. 5 is a cross-sectional view of a display device according to another exemplary embodiment of the present invention taken along the line I-I' of FIG. 2 or FIG. 3. FIG. 6 is a cross-sectional view of a display device according to an exemplary embodiment of the present invention taken along the line J-J' of FIG. 3. FIG. 7 is a cross-sectional view of a display device according to another exemplary embodiment of the present invention taken along the line J-J' of FIG. 3.

It should be noted that the metal layer 160 as shown in the figures can represent any of gate pad metal layers, data pad metal layers, gate fanout metal layers, and data fanout metal layers. The metal layer 160 may be made of a single layer such as chromium (Cr) or an alloy thereof, aluminum (Al) or an alloy thereof, molybdenum (Mo) or an alloy thereof, titanium (Ti) or an alloy thereof, copper (Cu) or an alloy thereof, or a multilayer of an alloy including at least one metal, but the present invention is not limited thereto.

Firstly, a gate pad unit of a display device according to an exemplary embodiment of the present invention will be described with reference to FIG. 2 and FIG. 4.

An organic layer 120 is disposed on one surface of a substrate 110, and a plurality of gate pad metal layers 160 are formed at uniform intervals on the organic layer 120. A first insulating layer pattern 140 and a second insulating layer pattern 150 covering the gate pad metal layers 160 are formed on the side and upper part of the gate pad metal layers 160, and on a portion of the organic layer 120. As described above, the first insulating layer pattern 140 and the second insulating layer pattern 150 do not extend between two gate pad metal layers 160, thereby forming an opening 180 exposing a portion the organic layer 120. Compared with the case in which the first insulating layer pattern 140 and the second insulating layer pattern 150 are continuously formed to cover the entire surface of the organic layer 120 between the gate pad metal layers 160, when the opening 180 is formed, cracking that may be generated in the first insulating layer pattern 140, the second insulating layer pattern 150, and the gate pad metal layer 160 by pressure application during a module process may be reduced.

The first insulating layer pattern 140 and the second insulating layer pattern 150 do not extend completely across the gate pad metal layer 160, such that the first insulating layer pattern 140 and the second insulating layer pattern 150 have a contact hole 92. An assistance pad 170 made of a metal oxide is formed on the second insulating layer pattern 150, and the assistance pad 170 is contacted with the gate pad metal layer 160 through the contact hole 92. The assistance pad 170 may be omitted. The gate pad metal layer 160 may receive and transmit the electric signal from the outside to the gate line 20 through the contact hole 92.

Again referring to FIG. 2, when viewing the gate pad metal layer 160 on the substrate, the gate pad metal layer 160 does not have a simple linear shape, but may have a linear shape including curved portions. When the gate pad metal layer 160 includes the curved portion, crack generation and the spread of the crack may be reduced. The curved portion may have a zigzag shape as in the present exemplary embodiment, but is not limited thereto, and the curved portion may have various shapes. Also, in FIG. 2, neighboring pads have the same shape, but the shape of the pads may be different from each other.

The width and thickness of the gate pad metal layer 160, the first insulating layer pattern 140, and the second insulating layer pattern 150, and the size of the opening 180 and the contact hole 92, may be changed according to the specific design process.

One of the first insulating layer pattern 140 and the second insulating layer pattern 150 may be removed near the gate pad metal layer 160, and one of the first insulating layer pattern 140 and the second insulating layer pattern 150 may be maintained.

The substrate 110 may be a plastic material. In this case, the plastic substrate 110 may include a polymer material having thermal resistance such as polyimide (PI), polyamide (PA), polyethylene terephthalate (PET), fiber-reinforced polymers (FRP), polycarbonate, polyethersulfone (PES), polyarylate (PAR) and polyethylene naphthalate (PEN). However, the material of the plastic substrate 110 is not limited to the described polymers. Any other material may be used if the material has sufficient heat resistance to allow a thin film process to be performed on the plastic substrate 110. The thickness of the plastic substrate 110 according to the present invention may be in the range of 100 µm to 300 µm. It is difficult to manufacture the plastic substrate 110 less than 100 µm, and even if it were manufactured, it would be unsuitable for use in the manufacturing process of the plastic liquid crystal display. Also, if the thickness of the plastic substrate 110 is more than 300 µm, it is unsuitable in light of the necessary thinness of the plastic liquid crystal display.

The organic layer 120, for planarization of the plastic substrate 110, is included in the components of the present exemplary embodiment, however it is not essential. An inorganic layer may be used instead of the organic layer 120, or a multi-layered structure of the organic layer and the inorganic layer may be used. The thickness of the organic layer 120 is in the range of 0.5 µm to 3 µm, and preferably about 1.5 µm, however the present invention is not limited thereto.

The first insulating layer pattern 140 and the second insulating layer pattern 150 may include an inorganic insulating material such as silicon nitride or silicon oxide. The first insulating layer pattern 140 and the second insulating layer pattern 150 may be made of the same kind of inorganic insulating material, however the present invention is not limited thereto. Also, the first insulating layer pattern 140 may have a multi-layered structure including a layer for improving contact with the metal pad and a layer having a function as a gate insulating layer.

Next, the data pad unit will be described with reference to FIG. 2 and FIG. 5, and description overlapping the above description will be omitted.

An organic layer 120 is disposed on one surface of the substrate 110, the first insulating layer patterns 140, formed at intervals, are formed on the organic layer 120, and a plurality of data pad metal layers 160 are formed on the first insulating layer pattern 140. The second insulating layer pattern 150 covering the side and upper portion of the data pad metal layer 160 and the first insulating layer pattern 140 are then formed. As described above, the first insulating layer pattern 140 and the second insulating layer pattern 150 do not extend between two neighboring metal pads, thereby forming an opening 180, such that a portion of the organic layer 120 is exposed. Compared with the case in which the first insulating layer pattern 140 and the second insulating layer pattern 150 are continuously formed to cover the entire surface of the organic layer 120 between the data pad metal layers 160, when the opening 180 is formed, cracking that may be generated in the first insulating layer pattern 140, the second insulating layer pattern 150, and the data pad metal layer 160 by the application of pressure during the module process may be reduced. The first insulating layer pattern 140 includes the inorganic insulating material such as silicon nitride or silicon oxide. The second insulating layer pattern 150 and the first insulating layer pattern 140 may be made of the same kind of inorganic insulating material, however the present invention is not limited thereto. Also, the first insulating layer pattern 140 may have the multi-layered structure including a layer for improving contact with the metal pad and a layer having a function as a gate insulating layer. The second insulating layer pattern 150 has a contact hole 94 exposing the data pad metal layer 160. An assistance pad 170 made of a metal oxide is formed on the second insulating layer pattern 150, and the assistance pad 170 is in contact with the data pad metal layer 160 through the contact hole 94. The assistance pad 170 may be omitted.

The width of the first insulating layer pattern 140 is larger than the width of the data pad metal layer 160, and the upper portion of the first insulating layer pattern 140 that is not covered by the data pad metal layer 160 is covered by the second insulating layer pattern 150.

However, in the present invention according to another exemplary embodiment, the width of the first insulating layer pattern 140 may be the same as the width of the data pad metal layer 160, and in this case, the second insulating layer pattern 150 may cover the side of the first insulating layer pattern 140 and the upper portion of the organic layer 120.

In the present exemplary embodiment, the second insulating layer pattern 150 is formed only on the first insulating layer pattern 140 such that the second insulating layer pattern 150 does not contact the organic layer 120, however, in another exemplary embodiment of the present invention, the second insulating layer pattern 150 may contact the side of the first insulating layer pattern 140 and the portion of the organic layer 120. However, in this case, the second insulating layer pattern 150 also has a shape exposing the portion of the surface of the organic layer 120.

Again referring to FIG. 2, the shape of the data pad metal layer 160 is not simply linear, but includes curved portions. That is, when the gate pad metal layer 160 includes the curved portion, the generation of a crack and the spread of the crack may be reduced.

Next, a gate pad unit of a display device according to an exemplary embodiment of the present invention will be described with reference to FIG. 3, FIG. 4, and FIG. 6.

Referring to FIG. 3, when viewing the gate pad metal layer 160 on the substrate, it does not have a simple linear shape, but has a shape of a plurality of rings P connected to each other in a line. That is, the pad unit includes the rings P such that the size of the formation region for the insulating layer is reduced, and the generation of the crack and the spread of the crack may be reduced. The shape of the rings P may be a hexagon like the present exemplary embodiment, but it is not limited thereto, and the rings P may have various shapes. Also, in FIG. 3, the neighboring pad units have the same shape, however the shape of each pad unit may be different.

In the present exemplary embodiment, the cross-section of the gate pad unit taken along the line I-I' is shown in FIG. 4 and is the same as the above description such that the overlapping description is omitted. Referring to the cross-section of the gate pad unit taken along the line J-J' with reference to FIG. 6, the organic layer 120 is disposed on the substrate 110, and the gate pad metal layers 160 that are separated from each other are formed on the organic layer 120. The first insulating layer pattern 140 and the second insulating layer pattern 150 have an opening 180 exposing the organic layer 120 between two neighboring gate pad metal layers 160, and cover the organic layer 120 in the rings P. The first insulating layer pattern 140 and the second insulating layer pattern 150 have a contact hole 92 exposing the upper portion of the gate pad metal layer 160. That is, the ring P is the region covered by the first insulating layer pattern 140 and the second insulating layer pattern 150, the opening 180 is the region where the organic layer 120 is exposed, and the contact hole 92 is the region where the portion of the gate pad metal layer 160 is exposed. An assistance pad 170 made of the metal oxide is formed on the second insulating layer pattern 150, and the assistance pad 170 contacts the gate pad metal layer 160 through the contact hole 92. The assistance pad 170 may be omitted.

One of the first insulating layer pattern 140 and the second insulating layer pattern 150 may be completely removed, and only one of the first insulating layer pattern 140 and the second insulating layer pattern 150 may remain near the gate pad metal layer 160.

Next, the data pad unit will be described with reference to FIG. 3, FIG. 5, and FIG. 7.

Referring to FIG. 3, when viewing the data pad metal layer 160 on the substrate, the data pad metal layer 160 does not have a simple linear shape, but has a shape of a plurality of rings P connected to each other in a line. That is, the pad unit includes the rings P such that the size of the formation region for the insulating layer is reduced, and the generation of the crack and the spread of the crack may be reduced. The shape of the rings P may be a hexagon like the present exemplary embodiment, but it is not limited thereto, and the rings P may have various shapes. Also, in FIG. 3, the neighboring pad units have the same shape, however the shape of each pad unit may be different.

The organic layer 120 is disposed on one surface of the substrate 110, the first insulating layer patterns 140, formed at intervals, are formed on the organic layer 120, and a plurality of data pad metal layers 160 are formed on the first insulating layer pattern 140. In the present exemplary embodiment, the data pad metal layers 160 are disposed on the portions where the first insulating layer patterns 140 are formed on the organic layer 120, but the present invention is not limited thereto.

In the present exemplary embodiment, the cross-section of the data pad unit taken along the line I-I' is shown in FIG. 5 and is the same as the above description such that the overlapping description is omitted. Referring to the cross-section of the data pad unit taken along the line J-J' with reference to FIG. 7, the second insulating layer pattern 150 is formed between two neighboring data pad metal layers 160 formed on one first insulating layer pattern 140, and this portion becomes the ring P. The second insulating layer pattern 150 covers the side and a portion of the upper portion of the data pad metal layer 160, and the first insulating layer pattern 140. The upper portion of the data pad metal layer 160 left exposed by the second insulating layer pattern 150 becomes the contact hole 94. An assistance pad 170 made of the metal oxide is formed on the second insulating layer pattern 150, and the assistance pad 170 contacts the data pad metal layer 160 through the contact hole 94. The assistance pad 170 may be omitted. The organic layer 120 is exposed between the neighboring first insulating layer patterns 140 thereby forming the opening 180 such that cracking that may be generated in the insulating layer by the pressure application during the module process may be reduced. The first insulating layer pattern 140 and the second insulating layer pattern 150 may include inorganic insulating material such as silicon nitride or silicon oxide. The first insulating layer pattern 140 and the second insulating layer pattern 150 may be formed of inorganic insulating material of the same kind, however the present invention is not limited thereto.

Figure 8:
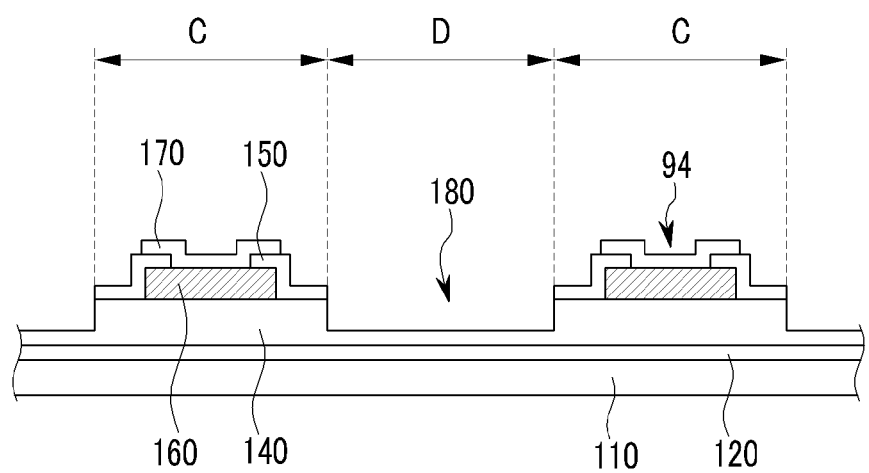
FIG. 8 is a cross-sectional view of a display device according to another exemplary embodiment of the present invention taken along the line I-I' of FIG. 2 or FIG. 3.

Next, a data pad unit according another exemplary embodiment of the present invention will be described with reference to FIG. 8. FIG. 8 is a cross-sectional view of a display device according to another exemplary embodiment of the present invention taken along the line I-I' of FIG. 2 or FIG. 3. In the above-described exemplary embodiments, the portion of the organic layer 120 is exposed by the first insulating layer pattern 140, however, in the present exemplary embodiment, the first insulating layer pattern 140 disposed on the portion (region C) under the data pad metal layer 160 has a different thickness from the first insulating layer pattern 140 disposed on the portion (region D) where the opening 180 is positioned. The first insulating layer pattern 140 (region C) under the data pad metal layer 160 is thicker than the portion (region D) where the opening 180 is disposed such that the generation of a crack may be reduced.

Figure 9:
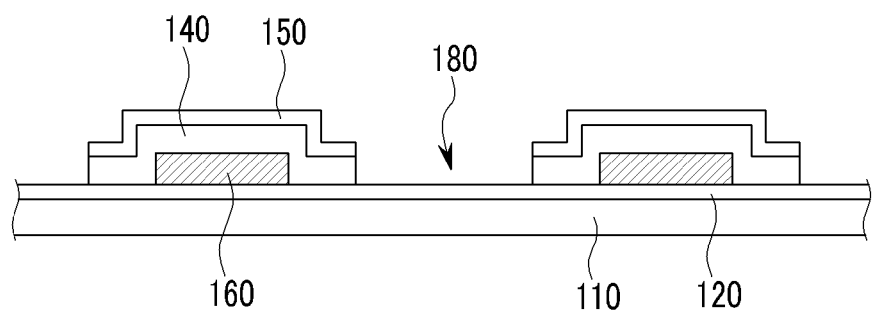
FIG. 9 is a cross-sectional view of a region A of FIG. 1 according to an exemplary embodiment of the present invention.
Figure 10:
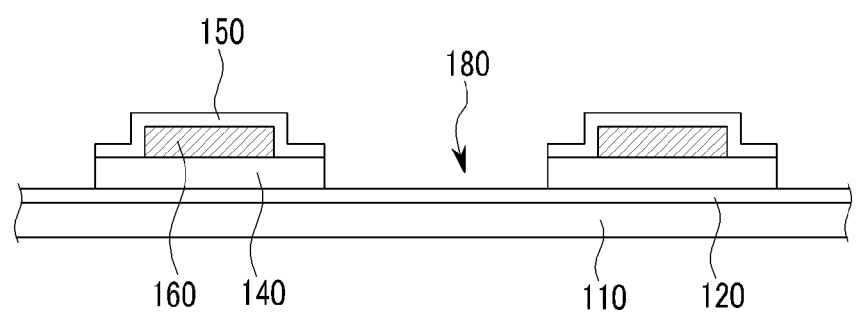
FIG. 10 is a cross-sectional view of a region B of FIG. 1 according to an exemplary embodiment of the present invention.

Next, a gate fanout unit A and a data fanout unit B will be described in detail with reference to FIG. 9 and FIG. 10. FIG. 9 is a cross-sectional view of a region A of FIG. 1 according to an exemplary embodiment of the present invention, and FIG. 10 is a cross-sectional view of a region B of FIG. 1 according to an exemplary embodiment of the present invention.

Although a layout view of the gate fanout unit A is not illustrated, the gate fanout unit A may have a linear shape including curved portions or a structure in which the rings with the hexagonal shape are connected in a line, like the gate pad unit. The data fanout unit B may also have the same shape as the data pad unit.

Firstly, the gate fanout unit A will be described with reference to FIG. 9. An organic layer 120 is formed on one surface of the substrate 110, and a plurality of gate fanout metal layers 160 that are separated from each other by intervals are formed on the organic layer 120. The first insulating layer pattern 140 and the second insulating layer pattern 150 cover the side and the upper portion of the gate fanout metal layers 160, and a portion of the organic layer 120. As described above, the first insulating layer pattern 140 and the second insulating layer pattern 150 do not extend between two neighboring gate fanout metal layers 160, thereby creating the opening 180 exposing the portion of the organic layer 120. Compared with the case in which an insulating layer covers the entire surface of the organic layer 120 on the region where the gate fanout metal layers 160 are not formed, the formation of the opening 180 may reduce the generation of the crack generated in the insulating layer by the pressure application during the module process. Unlike the gate pad unit, the gate fanout unit does not have a contact hole exposing the gate fanout metal layer 160, and the first insulating layer pattern 140 and the second insulating layer pattern 150 cover the entire upper portion of the gate fanout metal layer 160.

Next, a data fanout unit will be described with reference to FIG. 10, and the overlapping description will be omitted.

The data fanout unit of the present exemplary embodiment is similar to the data pad unit of FIG. 5, except that the contact hole is not formed. That is, the data fanout unit does not have a contact hole exposing the data fanout metal layers 160, and the second insulating layer pattern 150 covers the entire upper portion of the data fanout metal layers 160. In the present exemplary embodiment, the first insulating layer pattern 140 and the second insulating layer pattern 150 have the opening 180 exposing the organic layer 120 such that the generation and the spread of the crack in the insulating layer may be prevented.

As described above, in the present exemplary embodiments, the insulating layer does not extend to portions of the organic layer 120 in the pad unit, the fanout unit, or both the pad unit and the fanout unit thereby forming the opening 180 to expose the organic layer 120, or the thickness of the insulating layer under the metal pad unit and of the portion corresponding to the opening 180 are different such that the generation and the spread of the crack may be reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device comprising:
a substrate;
a plurality of gate pad metal layers disposed in a first direction on the substrate;
a plurality of data pad metal layers disposed in a second direction on the substrate;
a gate fanout unit connecting the gate pad metal layers and gate lines of a display area;
a data fanout unit connecting the data pad metal layers and data lines of the display area;
an upper insulating layer pattern disposed on the plurality of gate pad metal layers, the plurality of data pad metal layers, the gate fanout unit, and the data fanout unit, and
a lower insulating layer pattern disposed between the substrate and both the plurality of data pad metal layers and data fanout unit,
wherein the upper insulating layer pattern does not completely cover a first region between two neighboring gate pad metal layers, a second region between two neighboring data pad metal layers, or both the first region and the second region, thereby forming a first opening, and
wherein the thickness of the lower insulating layer pattern disposed under the plurality of data pad metal layers is different from the thickness of the lower insulating layer pattern disposed in the first opening.

2. The display device of claim 1, wherein the substrate comprises a plastic material.

3. The display device of claim 2, further comprising an organic layer disposed between the substrate and both the plurality of gate pad metal layers and gate fanout unit.

4. The display device of claim 3, wherein the upper insulating layer pattern comprises a contact hole partially exposing each of the plurality of gate pad metal layers.

5. The display device of claim 4, wherein the upper insulating layer pattern does not completely cover a region between two neighboring gate fanout units, thereby forming a second opening.

6. The display device of claim 5, wherein the organic layer is exposed through the first opening and the second opening.

7. The display device of claim 1, wherein at least one of the plurality of gate pad metal layers and the gate fanout unit has a linear shape comprising curved portions.

8. The display device of claim 1, wherein at least one of the plurality of gate pad metal layers and the gate fanout unit has a shape of a plurality of rings connected to each other in a line.

9. The display device of claim 8, wherein each ring in the plurality of rings is hexagonal.

10. The display device of claim 1, wherein the upper insulating layer pattern comprises a contact hole partially exposing each of the plurality of data pad metal layers.

11. The display device of claim 10, wherein at least one of the plurality of data pad metal layers and the data fanout unit has a linear shape comprising curved portions.

12. The display device of claim 10, wherein at least one of the plurality of data pad metal layers and the data fanout unit has a shape of a plurality of rings connected to each other in a line.

13. The display device of claim 12, wherein each ring in the plurality of rings is hexagonal.

14. The display device of claim 1, further comprising an organic layer disposed between the substrate and the lower insulating layer pattern.

15. The display device of claim 14, wherein the upper insulating layer pattern does not completely cover a region between two neighboring data fanout units, thereby forming a second opening.

16. The display device of claim 15, wherein the lower insulating layer pattern has a third opening in positions corresponding to the first opening and the second opening, such that the organic layer is exposed through the first opening, the second opening, and the third opening.

17. The display device of claim 16, wherein the width of the lower insulating layer pattern under each of the plurality of data pad metal layers is equal to or larger than the width of each of the plurality of data pad metal layers.

18. The display device of claim 1, wherein the lower insulating layer pattern disposed in the first opening is thinner than the lower insulating layer pattern disposed under the plurality of data pad metal layers.

* * * * *